United States Patent [19]

Kim et al.

[11] Patent Number: 4,659,423

[45] Date of Patent: Apr. 21, 1987

[54] SEMICONDUCTOR CRYSTAL GROWTH VIA VARIABLE MELT ROTATION

[75] Inventors: Kyong-Min Kim, Hopewell Junction; Pavel Smetana, Poughkeepsie; Wolfgang A. Westdorp, Hopewell Junction, all of N.Y.

[73] Assignee: International Business Machines Corporation, Armonk, N.Y.

[21] Appl. No.: 856,872

[22] Filed: Apr. 28, 1986

[51] Int. Cl.$^4$ ............ C30B 15/30; C30B 35/00; C30B 13/24; C30B 13/30

[52] U.S. Cl. ............ 156/617 SP; 156/622; 156/618; 156/605; 422/249

[58] Field of Search ......... 156/618, 617 SP, 622, 156/DIG. 62, 605; 422/249

[56] References Cited

U.S. PATENT DOCUMENTS

| | | | |
|---|---|---|---|
| 2,686,865 | 8/1954 | Kelly, Jr. | 156/DIG. 62 |
| 3,493,770 | 2/1970 | Dessauer et al. | 250/217 |
| 3,607,139 | 5/1971 | Hanks | 156/617 SP |
| 3,929,557 | 12/1975 | Goodrum | 156/618 |
| 4,040,895 | 8/1977 | Patrick et al. | 156/618 |
| 4,073,355 | 2/1978 | Schmidt et al. | 156/601 |
| 4,176,002 | 11/1979 | Quewisset et al. | 156/618 |
| 4,565,671 | 1/1986 | Matsutani et al. | 422/249 |
| 4,569,828 | 2/1986 | Nishizawa | 156/617 SP |

FOREIGN PATENT DOCUMENTS

| | | | |
|---|---|---|---|
| 1111544 | 3/1956 | France | 156/617 SP |
| 59-73491 | 4/1984 | Japan | 156/617 SP |
| 1347108 | 2/1974 | United Kingdom | 156/617 SP |
| 2059932A | 4/1981 | United Kingdom | |
| 2109267 | 6/1983 | United Kingdom | 156/618 |

OTHER PUBLICATIONS

Hoshikawa, et al—Jap. Jour. Applied Physics, vol. 19, No. 1, Jan. 1980, pp. L33-L36.
H. J. Scheel et al, J. Crystal Growth 49 (1980) 291–296.
J. Crystal Growth 8 (1971) 304–306, H. J. Scheel et al.
T. Suzuki, et al "CZ Silicon Crystals Grown in a Transverse Magnetic Field".
K. M. Kim, J. Elec. Chem. Soc. vol. 129, No. 2, Feb. 1982, pp. 427–429.

*Primary Examiner*—Gary P. Straub
*Attorney, Agent, or Firm*—William T. Ellis

[57] ABSTRACT

An improvement in the method and apparatus for growing a semiconductor crystal by the Czochralski technique comprising the steps of applying a rotating transverse magnetic field to molten semiconductor material held in a crucible during the seed crystal pulling and crystal formation step, to cause the molten material to rotate within the crucible, and simultaneously increasing the rotational velocity of the magnetic field during this crystal formation as a function of the length of the crystal pulled from said molten material to thereby vary the rotation rate of the molten material. These steps result in the uniform axial distribution of oxygen in the crystal.

48 Claims, 5 Drawing Figures

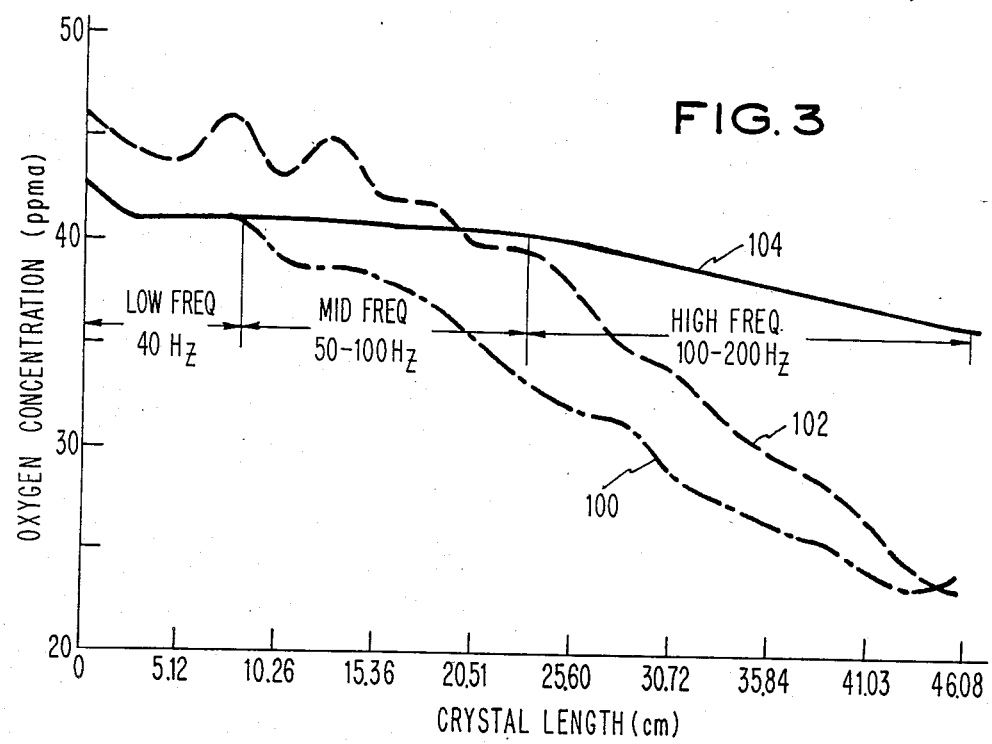
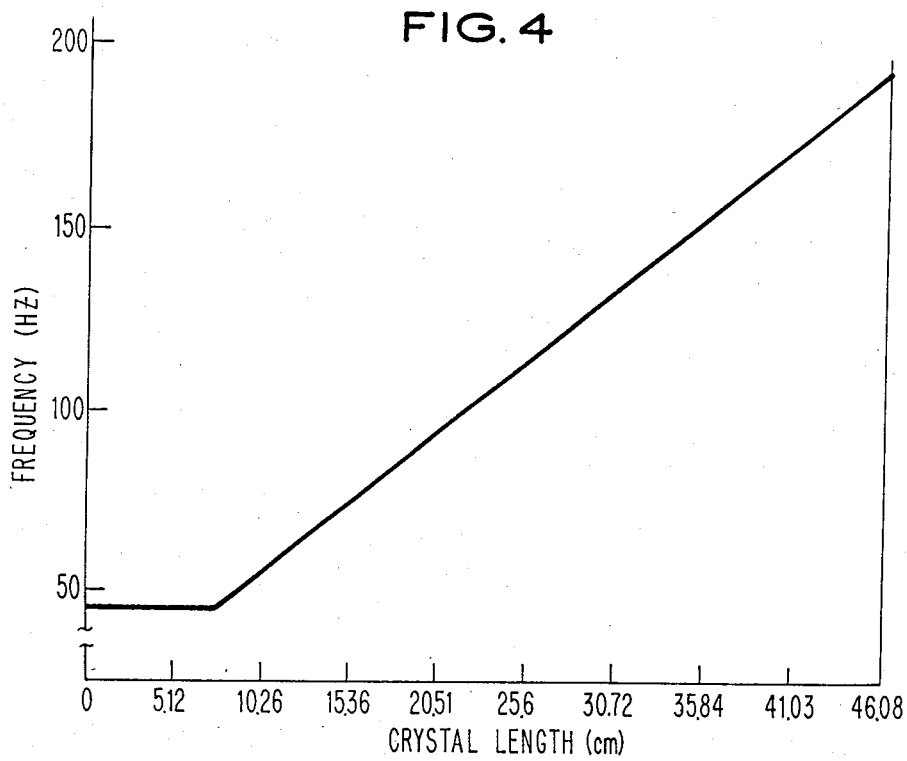

SEMICONDUCTOR CRYSTAL GROWTH VIA VARIABLE MELT ROTATION

BACKGROUND OF THE INVENTION

The present invention relates generally to a crystal growing method and apparatus therefor, and more particularly, to a crystal growing method and apparatus for growing single crystals with a uniform axial oxygen concentration in the crystal.

In the growing of crystals for the manufacture of very large-scale integrated circuit devices, it has been discovered that it is essential that the oxygen concentration in the as-grown crystal be controlled as accurately as possible. In this regard, it has been found that oxygen incorporated in the crystal lattice is important for gettering impurities out of the crystal. Additionally, the presence of oxygen in the crystal lattice provides the crystal with a required hardness characteristic. Accordingly, it is highly desirable to produce a semiconductor crystal having a uniform oxygen concentration throughout the length of the crystal.

Axial non-uniformity of the oxygen concentration in the crystal lattice is a particular problem in standard crystal growing techniques such as the Czochralski technique. Referring particularly to the Czochralski technique for growing semiconductor single crystals, a high purity semiconductor material is melted in a container and the temperature of the molten material is maintained just above the melting point of the material. A particularly oriented seed crystal is then dipped into the melt liquid or material adheres to the seed by surface tension and adhesive forces. Under the correct conditions, a crystal will grow as the seed is slowly pulled away from the melt.

With this technique, oxygen enters the melt in the following manner. The crucible in which the melt is contained is typically made either of silica or graphite coated with silica. At the melt temperature of silicon (about 1400° C.), the surface of the silica crucible which is in contact with the melt dissolves and forms silicon monoxide, SiO. This silicon monoxide enters the melt and essentially constitutes the source of oxygen in the melt and in the drawn crystal.

It has been found that the oxygen concentration in the crystal from this silicon monoxide is not constant, but varies from the seed end of the crystal, where it is at its highest level, to the tail end of the crystal, where it is at its lowest level. Initially, the oxygen content of the melt is on the order of $2 \times 10^{18}$ atoms per cubic centimeter (approximately the saturation point). The oxygen in the grown crystal pulled from this melt ranges from approximately $1.5 \times 10^{18}$ atoms/cc in the seed end of the crystal down to approximately $6 \times 10^{17}$ atoms/cc at the tail end of the crystal. It is thus apparent that the oxygen content of the melt is depleted during the crystal growing process. It is speculated that this oxygen depletion in the melt is due to a lower dissolution rate of the crucible as the growing process proceeds and the melt level in the crucible decreases.

The above described oxygen concentration axial non-uniformity in the semiconductor crystal means that a substantial portion of the crystal will be lost or rejected because of the oxygen level being outside specification. Additionally, this axial non-uniformity imposes the requirement that any wafers cut from a given axial position in the crystal boule be analyzed and sorted according to their particular oxygen content. This wafer testing and sorting in accordance with oxygen content is both costly and time consuming, and thus highly undesirable in a production environment.

There have been a number of different approaches to controlling the oxygen content in semiconductor crystals to thereby avoid these testing and sorting steps. By way of example, Hoshikawa et al. Japanese Journal of Applied Physics, Vol. 19, No. 1, January 1980, pp. L33–36, discloses a silicon growth process for obtaining axial uniformity of the oxygen concentration in the crystal by rotating the seed, the crucible, and the melt. The melt is rotated by means of a rotating magnetic field applied via the application of a three-phase current to a three-phase graphite heater. The reference describes the use of various different rotation directions for the seed, the crucible, and the melt. In one particular experiment, the seed, the crucible, and the melt were all rotated in the same direction but the seed rotation rate was linearly decreased from 20 to 10 rpm during the top-to-bottom growth process of the crystal ingot. However, the crystal resulting from this variation of the seed rotation rate did not have a sufficiently uniform axial oxygen concentration for semiconductor manufacturing purposes. Additionally, the variation of the seed rotation rate caused a concomitant loss of uniformity in the radial oxygen concentration in the crystal.

The reference Kim et al., IBM Technical Disclosure Bulletin, Vol. 25, No. 5, October 1982, p. 2277, also is directed to controlling crystal oxygen concentration and specifically discloses a silicon growth process wherein the rotation of the melt is first accelerated, then decelerated, by means of the periodic interchange of two of three phases of a signal applied to a three phase AC heater. However, this periodic acceleration and deceleration of the melt rotation rate is for the purpose of obtaining a uniform mixing of the melt in the radial direction, and is not concerned with the axial oxygen concentration in the crystal.

The invention as claimed is intended to remedy the above described oxygen concentration non-uniformity along the length of the crystal.

The advantages offered by the present invention are that a uniformity of oxygen concentration is obtained axially along the length of the crystal. Likewise, the oxygen segregation/mixing in the crystal is controlled. This resulting uniformity of oxygen concentration along the length of the crystal permits the elimination of the previously required oxygen concentration testing and sorting steps. Furthermore, a significant increase in crystal growth yield is obtained.

SUMMARY OF THE INVENTION

Briefly, the present invention comprises an improvement in an apparatus for growing a crystal by the Czochralski method, wherein the apparatus comprises a crucible for containing a molten material from which the semiconductor crystal is to be grown, a heater for melting the material and maintaining the material in a molten state, a seed holder for holding a monocrystalline seed, and means operable to dip the seed into the molten material and to withdraw the seed to thereby grow a crystal of increasing length. The improvement comprises the inclusion of means designed for rotating *only* the molten material at a particular rotation rate, and means for controlling the rotation means to vary the rotation rate of the molten material as a function of the length of the crystal grown from the molten material.

In one embodiment of the present invention, the rotating means comprises means for generating a rotating transverse magnetic field in the molten conductive material in the crucible to thereby rotate the material.

In a further embodiment, the magnetic field generating means comprises means for generating an n-phase alternating current signal at a frequency which varies as a function of the length of the crystal grown from the molten material, and an n-phase magnetic structure surrounding the crucible and connected to receive current from the n-phase current generating means for generating the transverse magnetic field in the molten material.

In a preferred embodiment, the n-phase alternating current generating means comprises means for generating an n-phase signal which varies in frequency over the range 30–200 Hz.

In the above described embodiments, either the seed or the crucible or both may also be rotating in conjunction with the melt material. In a preferred embodiment, the seed is rotated in a direction opposite to that of the melt material, while the crucible is rotated in the same direction as the melt material.

In a preferred embodiment, the n-phase magnetic structure includes structure for heating the molten material with an n-phase power supply with variable frequency capability. The n-phase alternating current generating means includes a direct current source for generating direct current, means for controlling the power of the direct current generated by the direct current source in accordance with the temperature of the molten material, and means for generating the n-phase alternating current from the power-controlled direct current.

When the above described embodiments are utilized to form silicon crystals, the n-phase alternating current generating means may comprise means for generating the n-phase alternating current with a frequency which varies in accordance with the following equation:

Frequency (Hz) = 40 + (4) × (L − 7.5), where L is the length of the crystal in cm.

The present invention also includes an improvement in the method of growing semiconductor crystals by the Czochralski method. This improvement in the method comprises the steps of applying a rotating transverse magnetic field to the molten material during the growing of the crystal to cause it to rotate; and varying the rotational velocity of the magnetic field during the crystal growing as a function of the length of the crystal grown from the molten material to thereby vary the rotation rate of the molten material.

In a preferred embodiment of this method, the seed crystal and the crucible are rotated, and the varying velocity rotating transverse magnetic field is generated by generating an n-phase alternating current at a frequency which increases as a function of the length of the crystal grown from the molten material, where n is at least 3. This n-phase current is applied to an n-phase magnetic heating structure surrounding the crucible for heating the molten material and for generating the transverse magnetic field in the molten material to cause it to rotate. This preferred method includes the step of maintaining the temperature of the molten material approximately constant.

BRIEF DESCRIPTION OF THE DRAWING

FIG. 3 is a graph of the oxygen concentration (ppma) versus crystal length (cm).

FIG. 4 is a graph of the frequency (Hz) versus crystal length (cm).

DETAILED DESCRIPTION OF THE PREFERRED EMBODIMENT

Figure 1A:
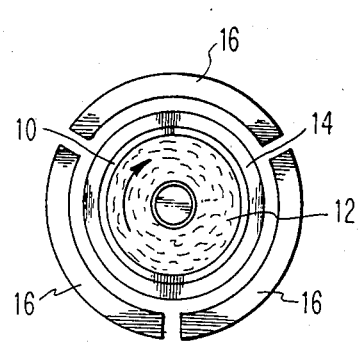
FIG. 1A and FIG. 1B comprise schematic sectioned views of a standard Czochralski silicon crystal growth apparatus with a 3-phase AC heater.

The present invention is an improvement in the method and apparatus used in growing single crystals of semiconductor material by means of the well-known Czochralski method. In the Czochralski method, a charge of very pure silicon, from which the single crystal is to be grown, is placed in a crucible. The surface of the crucible which is in contact with the semiconductor melt is highly pure silica. If a doping impurity is to be added to the crystal, it is added to the charge of silicon. The crucible containing the charge is placed in a controlled inert atmosphere such as argon. Three-phase carbon resistant heaters encircle the crucible and introduce heat and cause the charge temperature to be stabilized just above the melting point of the semiconductor material. A seed crystal, which is a small highly perfect crystal of semiconductor material, is attached to the end of a pulling rod. An example of a typical seed crystal is a square rod of silicon of about 0.64 cm in diameter and about 7.68 cm in length. The pulling rod is actuated by a conventional crystal pulling mechanism which controls its upward movement at a selected uniform rate such as from about 0.64 cm to 10.24 cm per hour. The seed crystal is lowered into the molten semiconductor and is permitted to partially melt in order to remove any surface imperfections. The seed is then slowly withdrawn from the melt and rotated at a rate of, for example, 5–25 rpm while it is being withdrawn so that a cylindrical crystal is produced. The drawing rate and heating of the charge of silicon is made higher initially in order to minimize or eliminate all dislocations which occur when the seed is first introduced into the molten semiconductor material. After this so-called necked-down portion is formed in the crystal, the drawing rate and power to the heating coils are lowered until the desired crystal diameter of from about 2.56–12.8 cm is obtained. This diameter is then maintained until close to the end of the crystal drawing process. Typically a 30 cm long crystal is produced. This crystal is then cut into thin slices, commonly referred to as wafers, which, after thinning and polishing, are subjected to a conventional series of epitaxy, masking, diffusion, and metallization steps required to produce microelectronic components. The above-described method constitutes a brief description of the standard Czochralski crystal growing procedure.

As noted previously, crystals grown using the above described process contain oxygen in amounts from about $1.5 \times 10^{17}$ atoms/cc at the seed end of the crystal to about $6 \times 10^{17}$ atoms/cc at the tail end of the crystal. This oxygen content results from the contact of the hot melt material with the silica surface of the crucible which forms silicon monoxide and thereby introduces oxygen into the melt material. It is believed that initially the oxygen content in the melt is about at saturation or about $2 \times 10^{18}$ atoms/cc of oxygen. The concentration of oxygen decreases during the crystal pulling process due to a lower dissolution rate of the crucible surface. This lower effective dissolution rate is attributed to the relative decrease of the crucible area in contact with the silicon melt, and also to a relative decrease of mixing in the melt.

The present invention modifies the above described Czochralski process by rotating the molten material at a rotation rate which varies as a function of the length of the crystal grown from the molten material. This modification to the Czochralski method results in axially uniform oxygen content in the grown crystal.

Figure 1B:
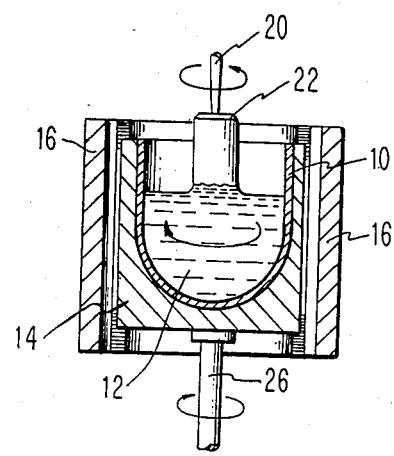

Referring now to FIG. 1, there is shown a top and a side sectioned view of a standard Czochralski crystal growth apparatus. The apparatus comprises a conventional silica crucible 10 for holding a semiconductor melt 12. In the embodiment used for the present example, this semiconductor melt is pure silicon. A susceptor 14 is disposed around the crucible 10 in order to provide mechanical support therefor. Typically this susceptor 14 will be made from a graphite material. A heater element 16 is disposed around the crucible-susceptor combination. In a preferred embodiment, this heater 16 comprises a 3-phase alternating current heating structure for heating the crucible. This resistance heating is accomplished simply by applying 3-phase alternating current to 3 standard heating coils disposed in the heater 16 around the periphery of the crucible 10. Note that the three individual sections of the heater 16 which contain respective heating coils can be seen in the top view shown in FIG. 1A. The heater 16 is operated to maintain the molten material 12 at a temperature just above its melting point. A seed crystal 20 is shown in FIG. 1B along with a portion of the grown crystal 22 attached to the bottom of the seed crystal 20. The seed crystal 20 may be rotated by standard apparatus (not shown) well known in the art in order to obtain a cylindrical configuration for the grown crystal 22. Likewise, the crucible 10 may be rotated, by way of example, by means of the attachment of a standard driving rod 26 connected to the bottom center of the susceptor 14. The driving rod 26 may, in turn, be connected to a standard rotation apparatus (not shown).

The present invention resides in the rotation of the molten material melt 10 at a rotation rate which varies as a function of the length of the crystal 22 grown from the molten material 12. Typically, the crystal length will be measured beginning after the necked down portion thereof and at the point where the full crystal diameter is established, i.e., after the crystal shoulder. The molten material rotation and rotation variation may be accomplished by a variety of different techniques. However, in a preferred embodiment, the molten material rotation is obtained simply by rotating the transverse magnetic field generated by the heating coils of the heater 16 in the molten material 12. As is well known in the art, the semiconductor material, when in its molten state, is highly conductive. Accordingly, the AC current flowing in the heating coils in the heater 16 induce currents and magnetic fields within the molten material 12. The molten material rotation is obtained by the electro-magnetic coupling between the currents and the magnetic fields induced in the molten material and the 3-phase alternating current flowing in the 3-phase heater 16. This electro-magnetic coupling is sometimes referred to as hydro-electro-magnetic coupling, and may be analogized to the operation of an AC motor consisting of a field and an armature.

Figure 2:
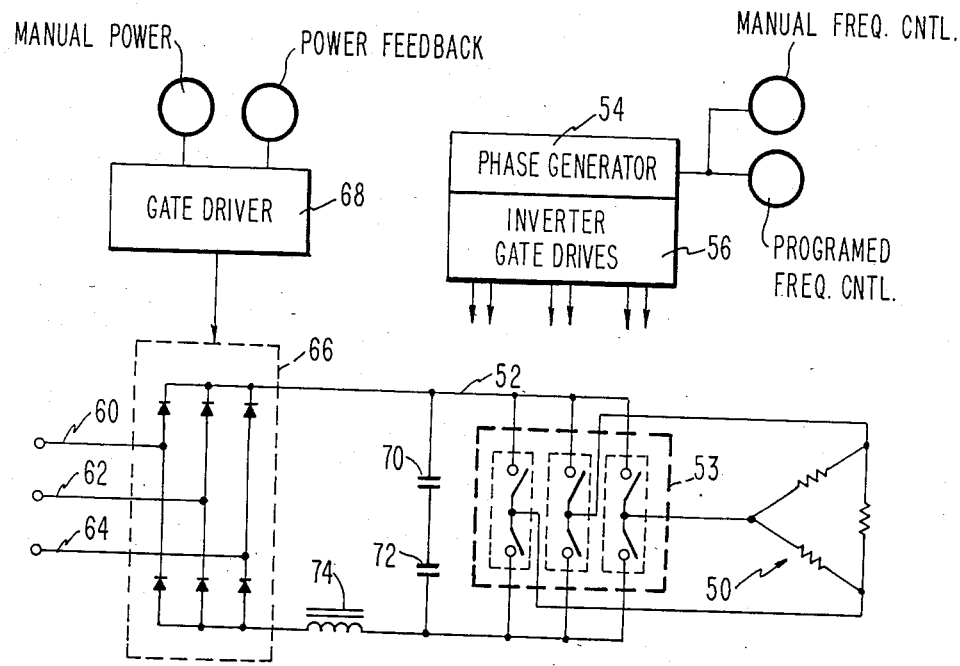
FIG. 2 is a schematic diagram of the frequency and power control circuitry that may be used to implement one embodiment of the present invention.

A circuit for generating the 3-phase alternating current which can be utilized to vary the rotation speed of the molten material 20 is shown in FIG. 2. Essentially, this figure sets forth a means for generating a 3-phase alternating current at a frequency which can be varied as a function of the length of the crystal grown from the molten material. Three windings 50 are shown in the figure to represent the 3-phase windings of the heater 16. A standard solid state switch 52, under the control of a phase generator 54 and an inverter gate drive 56, is utilized to control the gating of direct current from a line 52 to the various windings 50. This solid-state switch 53 and its attendant phase generator 54 and inverter gate drive 56 are standard items in the industry. By way of example, the solid-state switch 53 may be implemented by back-to-back silicon-controlled rectifiers which are gated to control both the direction and intensity of the current flowing into the windings 50, and thus the direction and intensity of the rotating magnetic field in the molten material 12. The phase generator 54 may be implemented simply by a standard logic board for providing 120 degrees phase angles to generate 3 phases at a desired frequency. This phase generator 54 then applies the requisite signals to control the inverter gate drives 56. There are a variety of equipments available in the market which may be utilized to implement the phase generator 54 and the inverter gate 56. By way of example, and not by way of limitation, the variable-frequency speed controller manufactured by Polyspede Model Number C 200/200/100 rated for a 200 KVA output and a 90 Hz maximum frequency may be utilized. The controller includes start, stop, and reverse push buttons, and further includes a 10 turn rotary dial potentiometer mounted on the enclosure door for varying the frequency of the output. The frequency may be varied, in the alternative, by means of a computer program. Polyspede also provides units with a capacity of 500 KVA and a maximum output frequency of 600 Hz.

One effect of varying the frequency of the alternating current applied to the heater windings 50 is that, at a constant current level, the power increases as the frequency increases. However, increasing the power to the heater windings 50 increases the heat applied by those windings to the crucible 10. This increased heat applied to the crucible causes a change in the diameter of the crystal 22. Some means is thus required in order to maintain the temperature of the molten material 12 approximately constant. In a preferred embodiment, this temperature maintenance in the molten material 12 may be accomplished by controlling the power of the direct current in the line 52 in accordance with the temperature of the molten material 12 to thereby maintain the temperature constant. In the embodiment shown in FIG. 2, the direct current on line 52 is generated by rectifying a 3-phase alternating current input from the lines 60, 62, and 64 by means of a rectifier 66. The rectifier 66 may be implemented by a standard silicon controlled rectifier power controller utilizing six SCR diodes. A gate driver 68 (for example, a magnetic amplifier) is utilized to control the point in each cycle of the individual phases in the 3-phase AC input when the SCR diodes are gated on. Thus, the gate driver 68 controls the amount of power in the DC current applied on line 52. The gate driver 68 may be controlled either manually, or by means of a control line from a sensor sensing the temperature in the molten material 12. A filter comprising the capacitors 70 and 72 and the inductance 74 is provided for filtering out any ripple in the rectified DC current applied to line 52.

From the above, it can be seen that the frequency of the 3-phase alternating current applied to the heater windings 50 is independent of the power applied to those windings and under separate control. Accordingly, the frequency of the 3-phase alternating current applied to these windings may be varied without having an effect on the diameter of the crystal 22.

In the experiments leading to the present invention, the configuration of FIG. 1 was utilized with a 65 volt, 800 ampere current applied to the 3-phase heater 16. The frequency converter used in the experiments comprising the elements 54, 56 and 68 was the frequency controller noted earlier designed by Polyspede to permit independent control of frequency and voltage. The output voltage was controlled by an external 0–5 ma signal from the previously noted temperature sensor. The frequency was controlled by the previously noted 10 turn rotary dial potentiometer. This frequency controller had a limited frequency range of 40–90 Hz. The molten material 12 utilized in the crucible was pure silicon with boron doping. The pull rate utilized was 7.0 cm/hour. With this pull rate, two crystals of silicon were grown at high and low frequencies, i.e., 40–50 Hz and 90 Hz. For both crystal growing sequences, the seed crystal 20 was rotated at −20 rpm in the opposite direction to the rotation of the molten material 12, while the crucible was rotated at 8 rpm in the same direction as the molten material 12 rotation. The axial profile of the oxygen concentration in each crystal was obtained by means of the Fourier Transform Infrared (FTIR) technique. The axial profile of the oxygen concentration (PPMA) versus the crystal length (cm) for the crystal grown with a heater frequency of 40–50 Hz is shown as curve 100 in FIG. 3. Likewise, the axial profile of the oxygen concentration of the crystal grown with a heater frequency of 90 Hz is shown as curve 102 in FIG. 3. It can be seen that these two axial profiles 100 and 102 are quite different. The crystal with the 90 Hz power has a higher oxygen concentration level by approximately 4 PPMA compared to the crystal grown with the 40–50 Hz heater power. Accordingly, these axial profiles evidence a definite effect of the frequency of the 3-phase power supply upon the axial profile. It is thus clear that by increasing the frequency as a function of the crystal length during the growth of the crystal, the oxygen level at the tail end of the crystal can be increased. The dashed-line curve 104 in FIG. 4 shows an axial oxygen profile with a desired ramping of the frequency. As indicated by FIG. 3, in order to grow the crystal from its initial point at the shoulder 22 to approximately 3 cm in length, the 3-phase heater windings 50 should be driven by a 3-phase signal at the 40 Hz. In order to grow the crystal from 3 cm to approximately 9 cm, the 3-phase heater windings 50 should be driven by a 3-phase signal at a frequency which varies over the range 50–90 Hz. For crystal lengths greater than 9 cm, the 3-phase heater windings 50 should be driven by a signal which is ramped or varied over the frequency range 100–200 Hz.

FIG. 4 represents a graph of the frequency variation which may be utilized in one embodiment of the present invention in order to grow silicon crystals. It can be seen that the initial frequency of the 3-phase signal is constant at approximately 40 Hz. At about 3 cm from the seed crystal, the frequency begins to rise linearly with the crystal length. This frequency variation can be represented in equation form as follows:

$$\text{Frequency (Hz)} = 40 + (4) \times (L - 7.5),$$

where L is the length of the crystal in cm.

Accordingly, a specific method and means have been disclosed for controlling the axial oxygen concentration in a semiconductor crystal by varying the molten material rotation rate as a function of the length of the crystal. This variation of the molten material rotation rate significantly affects the fluid flow dynamics in the melt, thereby controlling the oxygen mixing and incorporation into the crystal lattice, as well as the incorporation of any dopants and other impurities in the grown crystal.

The above described variation of the molten material rotation rate is achieved, in a preferred embodiment, by varying the frequency of the 3-phase power input to the 3-phase windings in the heater as a function of the length of the crystal. This frequency variation of the 3-phase power input may be varied over a wide range of from 0 to 600 Hz. A preferred range of frequency range variation is from 30 Hz to 200 Hz. This frequency variation effectively provides a uniform axial oxygen concentration profile in Czochralski silicon crystals.

It should be noted that during this frequency variation, the power applied to the heater windings should be independently controlled in order to maintain a constant temperature in the molten material 12.

It should also be noted that in the embodiment disclosed herein the seed crystal was rotated in a direction opposite to that of the molten material 12, while the crucible 10 was rotated in the same direction as the rotation of the molten material 12. The present invention is clearly not limited to this rotation combination, but encompasses a wide variety of different rotation speeds and directions of the molten material, the crucible, and the seed crystal.

Additionally, it should be noted that although the present invention was disclosed in the context of 3-phase power supply and 3-phase heater windings 50, the present invention is not limited thereto. In this regard, the heater windings 50 could comprise an n-phase structure and could be driven by an n-phase alternating current signal, where n is preferably at least 3.

It should likewise be noted that although the embodiment of the invention disclosed herein utilized the current through the heater windings 50 to effect the variation of the rotation of the molten material, the present invention is not limited thereto. In this regard, a separate structure could be utilized in order to obtain a variable rotation rate for the molten material in the crucible.

Additionally, it should be noted that the present invention is not limited to the frequency variation shown in FIG. 4, but can take a variety of forms which are not linear.

Finally, it should be noted that the present invention is not limited to the growing of silicon crystals. In this regard, the present method and apparatus could be utilized to obtain uniform axial distributions of various dopants and impurities in other semiconductor crystals such as GaAs.

While the present invention has been particularly shown and described with reference to preferred emodiments therefor, it will be understood by those skilled in the art that the foregoing and other changes in form and detail may be made therein without departing from the spirit and scope of the present invention.

We claim:

1. An improvement in an apparatus for growing a semiconductor crystal by the Czochralski method, said apparatus comprising a crucible for containing a molten material from which the semiconductor crystal is grown, a heater for melting said material and maintaining said material in a molten state, and a seed holder for holding a monocrystalline seed and means operable to dip said seed into said molten material and to withdraw said seed from said molten material to thereby grow a crystal of increasing length therefrom, said improvement comprising;

rotation means designed for rotating only said molten material at a rotation rate apart from said crucible rotation rate; and means for controlling said rotation means to increase the rotation rate of said molten material as a function of the increasing length of said crystal grown from said molten material.

2. The improvement as defined in claim 1, further comprising;

means for rotating said seed.

3. The improvement as defined in claim 1, further comprising;

means for rotating said crucible.

4. The improvement as defined in claim 1, further comprising:

means for rotating said seed in the opposite direction that said molten material is rotating; and means for rotating said crucible in the same direction that said molten material is rotating.

5. The improvement as defined in claim 1 wherein said molten material is highly conductive; and wherein said rotating means comprises means for generating a rotating transverse magnetic field in said molten conductive material in said crucible to thereby rotate said material.

6. The improvement as defined in claim 5, wherein said magnetic field generating means comprises means for generating an n+ phase alternating current at a frequency which varies as a function of the length of said crystal grown from said molten material, where n is at least three; and an n phase magnetic structure surrounding said crucible and connected to receive current from said n phase current generating means for generating said transverse magnetic field in said molten material.

7. The improvement as defined in claim 6, wherein said n phase alternating current generating means comprises means for generating an n phase signal which varies over the frequency range 30-200 Hz.

8. The improvement as defined in claim 3, further comprising:

means for rotating said seed.

9. The improvement as defined in claim 2, further comprising:

means for rotating said crucible.

10. The improvement as defined in claim 3, further comprising:

means for rotating said seed in the opposite direction that said molten material is rotating; and means for rotating said crucible in the same direction that said molten material is rotating.

11. The improvement as defined in claim 6, wherein said n phase magnetic structure includes structure for heating said molten material by radiation/conduction; and wherein said n phase alternating current generating means comprises:

a direct current source for generating direct current;

means for controlling the power of said direct current generated by said direct current source in accordance with the temperature of said molten material; and means for generating said n phase alternating current from said power-controlled direct current.

12. The improvement as defined in claim 6, wherein said molten material comprises silicon, and wherein said n phase alternating current generating means comprises means for generating said n phase alternating current with a frequency which varies in accordance with the following equation:

$$\text{Frequency (Hz)} = 40 + (4) \times (L - 7.5),$$

where L is the length of said crystal in cm.

13. The improvement as defined in claim 6, further comprising:

means for rotating said seed; and means for rotating said crucible.

14. The improvement as defined in claim 13, wherein said n phase alternating current generating means comprises means for generating an n phase signal which varies over the frequency range 30-200 Hz.

15. The improvement as defined in claim 14, wherein said n phase alternating current generating means includes means for providing constant electrical power to said n phase magnetic structure.

16. The improvement as defined in claim 14, wherein said molten material comprises silicon, and wherein said n phase alternating current generating means comprises means for generating said n phase alternating current with a frequency which varies in accordance with the following equation:

$$\text{Frequency (Hz)} = 40 + (4) \times (L - 7.5),$$

where L is the length of said crystal in cm.

17. The improvement as defined in claim 6, wherein said n phase alternating current generating means includes means for providing constant electrical power to said n phase magnetic structure.

18. The improvement as defined in claim 17, wherein said constant power providing means comprises:

a source of multi-phase alternating current; and a power controller for rectifying said multi-phase alternating current and controlling the power thereof in accordance with the temperature of said molten material.

19. An improvement in an apparatus for growing a semiconductor crystal by the Czochralski method, said apparatus comprising a crucible for containing a molten conductive material from which the semiconductor crystal is grown, a heater for melting said material and maintaining said material in a molten state, and a seed holder for holding a monocrystalline seed and means operable to dip said seed into said molten material and to withdraw said seed from said molten material to thereby grow a crystal of increasing length therefrom, said improvement comprising:

means for rotating said seed;

means for rotatiang said crucible;

means for generating an n phase alternating current at a frequency which increases as a function of the length of said crystal grown from said molten material, where n is at least three;

an n phase heating sturcture surrounding said crucible and connected to receive said n phase alternating current for inductively heating said molten material and for generating a transverse magnetic field in said molten material to cause it to rotate apart from said crucible rotation rate and at a rate approximately proportional to said frequency; and means for maintaining the temperature of said molten material approximately constant.

20. The improvement as defined in claim 19, wherein said n phase current generating means comprises means for generating said n phase current with a frequency that varies over the frequency range 30–200 Hz.

21. The improvement as defined in claim 20, wherein said seed rotating means comprises means for rotating said seed in the opposite direction that said molten material is rotating; and wherein said crucible rotating means comprises means for rotating said crucible in the same direction that said molten material is rotating.

22. The improvement as defined in claim 21, wherein said temperature maintaining means comprises means for controlling the power of said n phase current generated by said n phase current generating means to maintain the temperature of said molten material approximately constant.

23. The improvement as defined in claim 22, wherein said n phase alternating current generating means and said temperature control means comprise:

a source of multi-phase alternating current;

a power controller for rectifying said multi-phase alternating current into direct current and controlling the power thereof in accordance with the temperature of said molten material; and means for generating said n phase alternating current from said power-controlled direct current.

24. The improvement as defined in claim 23, wherein said molten material comprises silicon, and wherein said n phase alternating current generating means includes means for generating said n phase alternating current with a frequency which varies in accordance with the following equation:

$$\text{Frequency (Hz)} = 40 + (4) \times (L - 7.5),$$

where L is the length of said crystal in cm.

25. The improvement as defined in claim 19, wherein said molten material comprises silicon, and wherein said n phase alternating current generating means includes means for generating said n phase alternating current with a frequency which varies in accordance with the following equation:

$$\text{Frequency (Hz)} = 40 + (4) \times (L - 7.5),$$

where L is the length of said crystal in cm.

26. An improvement in a method of growing semiconductor crystals by the Czochralski technique wherein a semiconductor seed crystal is dipped into a crucible holding a molten conductive material suitable for semiconductor crystal growth and slowly withdrawn to grow a semiconductor crystal with a length which increases the further the seed crystal is withdrawn, said improvement comprising the steps of:

applying a rotating transverse magnetic field to said molten material during the gorwing of said crystal to cause it to rotate apart from said crucible rotation rate; and increasing the rotational velocity of said magnetic field during said crystal growing as a function of the increasing length of said crystal grown from said molten material to thereby vary the rotation rate of said molten material.

27. The method as defined in claim 26, further comprising the step of rotating said seed crystal.

28. The method as defined in claim 26, further comprising the step of rotating said crucible.

29. The method as defined in claim 26, further comprising the steps of:

rotating said seed crystal in the opposite direction that said molten material is rotating; and rotating said crucible in the same direction that said molten material is rotating.

30. The method as defined in claim 26, further comprising the step of maintaining the temperature in said molten material approximately constant.

31. The method as defined in claim 30, wherein said magnetic field applying step comprises the steps of:

generating an n phase alternating current at a frequency which varies as a function of the length of said crystal grown from said molten material, where n is at least three;

applying said n phase current to an n phase magnetic structure surrounding said crucible for generating said transverse magnetic field in said molten material.

32. The method as defined in claim 31, wherein said n phase current generating step comprises the step of generating said n phase current with a frequency that varies over the frequency range 30–200 Hz.

33. The method as defined in claim 31, further comprising the step of rotating said crucible.

34. The method as defined in claim 31, further comprising the step of:

rotating said seed crystal; and rotating said crucible.

35. The method as defined in claim 31, wherein said molten material is silicon, and wherein said n phase current generating step comprises the step of generating said n phase alternating current at a frequency which varies in accordance with the following equation:

$$\text{Frequency} = 40 + (4) \times (L - 7.5),$$

where L is the length of said crystal in cm.

36. The method as defined in claim 31, further comprising the steps of:

rotating said seed crystal in the opposite direction that said molten material is rotating; and rotating said crucible in the same direction that said molten material is rotating.

37. The method as defined in claim 36, wherein said n phase current generating step comprises the step of generating said n phase current to vary over the frequency range 30–200 Hz.

38. The method as defined in claim 36, wherein said molten material is silicon, and wherein said n phase current generating step comprises the step of generating said n phase alternating current at a frequency which varies in accordance with the following equation:

$$\text{Frequency} = 40 + (4) \times (L - 7.5),$$

where L is the length of said crystal in cm.

39. The method as defined in claim 31, wherein said n phase current applying step comprises the step of heating said crucible by induction by means of the n phase current applied to said n phase magnetic structure; and
wherein said n phase current generating step comprises the steps of:
generating a direct current;
controlling the power of said direct current in accordance with the temperature of said molten material to maintain said temperature constant; and
generating said n phase alternating current from said power-controlled direct current.

40. The method as defined in claim 39, wherein said direct current generating step and said power controlling step comprise the steps of:
obtaining a multi-phase alternating current; and
rectifying said multi-phase alternating current and controlling the power thereof in accordance with the temperature in said molten material.

41. An improvement in a method for growing semiconductor crystals by the Czochralski method wherein a semiconductor seed crystal is dipped in a crucible holding a conductive molten material suitable for semiconductor crystal growth and slowly withdrawn to grow a semiconductor crystal with a length which increases the further the seed crystal is withdrawn, said improvement comprising the steps of:
rotating said seed crystals;
rotating said crucibel;
generating an n phase alternating current at a frequency which increases as a function of the length of said crystal grown from said molten material, where n is at least three;
applying said n phase current to an n phase magnetic heating sturcture surrounding said crucible for heating said molten material and for generating a transverse magnetic field in said molten material to cause it to rotate apart from said crucible rotation rate; while
maintaining the temperature of said molten material approximately constant.

42. The method as defined in claim 41, wherein said n phase current generating step comprises the step of generating said n phase current with a frequency that varies over the frequency range 30-200 Hz.

43. The method as defined in claim 42, wherein said seed crystal rotating step comprises the step of rotating said seed crystal in the opposite direction that said molten material is rotating; and wherein said crucible rotating step comprises the step of rotating said crucible in the same direction that said molten material is rotating.

44. The method as defined in claim 43, wherein said temperature maintaining step comprises the step of controlling the power of said n phase current to maintain the temperature of said molten material approximately constant.

45. The method as defined in claim 44, wherein said power controlling step comprises the steps of:
generating a direct current;
simultaneously controlling the power of said direct current generated in said direct current generating step in accordance with the temperature of said molten material to maintain said temperature constant; and
generating said n phase alternating current from said power-controlled direct current.

46. The method as defined in claim 44, wherein said molten material is silicon, and wherein said n phase current generating step comprises the step of generating said n phase alternating current at a frequency which varies in accordance with the following equation:

$$\text{Frequency (Hz)} = 40 + (4) \times (L - 7.5),$$

where L is the length of said crystal in cm.

47. The method as defined in claim 41, wherein said temperature maintaining step comprises the steps of:
generating a direct current;
simultaneously controlling the power of said direct current generated in said direct current generating step in accordance with the temperature of said molten material to maintain said temperature constant; and
generating said n phase alternating current from said power-controlled direct current.

48. The method as defined in claim 47, wherein said molten material is silicon, and wherein said n phase current generating step comprises the step of generating said n phase alternating current at a frequency which varies in accordance with the following equation:

$$\text{Frequency (Hz)} = 40 + (4) \times (L - 7.5),$$

where L is the length of said crystal in cm.

* * * * *